(12) United States Patent
Geiger et al.

(10) Patent No.: US 11,728,001 B2
(45) Date of Patent: Aug. 15, 2023

(54) APPARATUSES FOR CHARACTERIZING SYSTEM CHANNELS AND ASSOCIATED METHODS AND SYSTEMS

(71) Applicant: Micron Technology, Inc., Boise, ID (US)

(72) Inventors: Markus H. Geiger, Boise, ID (US); Anthony D. Newton, Boise, ID (US); Ron A. Hughes, Kuna, ID (US); Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 341 days.

(21) Appl. No.: 17/099,694

(22) Filed: Nov. 16, 2020

(65) Prior Publication Data

US 2022/0157396 A1     May 19, 2022

(51) Int. Cl.
*G01R 31/28* (2006.01)
*G11C 29/02* (2006.01)
*G01R 31/317* (2006.01)
*G01R 31/30* (2006.01)
*G11C 29/04* (2006.01)

(52) U.S. Cl.
CPC ........ *G11C 29/025* (2013.01); *G01R 31/2818* (2013.01); *G01R 31/2863* (2013.01); *G01R 31/30* (2013.01); *G01R 31/317* (2013.01); *G11C 2029/0407* (2013.01)

(58) Field of Classification Search
CPC .. G01R 1/04; G01R 1/07328; G01R 31/2805; G01R 31/68; H05K 2201/09009
See application file for complete search history.

(56) References Cited

U.S. PATENT DOCUMENTS

| | | | |
|---|---|---|---|
| 6,462,570 B1 * | 10/2002 | Price | G01R 31/2818 324/762.02 |
| 7,098,680 B2 * | 8/2006 | Fukushima | G01R 31/2889 324/756.05 |
| 9,599,661 B2 * | 3/2017 | Wig | G01R 31/2863 |
| 2005/0225315 A1 * | 10/2005 | Goldsmith | G01R 1/0433 324/756.02 |

* cited by examiner

*Primary Examiner* — Tung X Nguyen
(74) *Attorney, Agent, or Firm* — Perkins Coie LLP

(57) ABSTRACT

Apparatuses for characterizing system channels and associated methods and systems are disclosed. In one embodiment, a tester is coupled to an adaptor configured to plug into a CPU socket of a system platform (e.g., a motherboard). The motherboard includes a memory socket that is connected to the CPU socket through system channels. The adaptor may include a connector configured to physically and electrically engage with the CPU socket, an interface configured to receive test signals from the tester, and circuitry configured to internally route the test signals to the connector. The adaptor, if plugged into the CPU socket, can facilitate the tester to directly assess signal transfer characteristics of the system channels. Accordingly, the tester can determine optimum operating parameters for the memory device in view of the system channel characteristics.

18 Claims, 4 Drawing Sheets

APPARATUSES FOR CHARACTERIZING SYSTEM CHANNELS AND ASSOCIATED METHODS AND SYSTEMS

TECHNICAL FIELD

The present disclosure generally relates to apparatuses for characterizing system channels, and associated methods and systems.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present disclosure.

DETAILED DESCRIPTION

Figure 1:
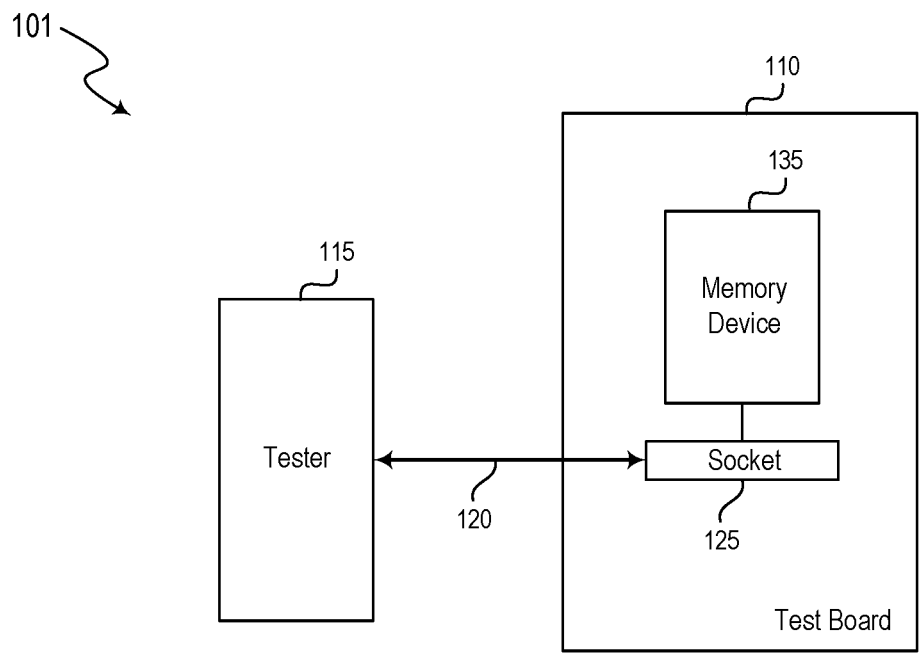
FIG. 1 is a block diagram illustrating a testing environment of a memory device.

Semiconductor devices delivering high performance (e.g., high bandwidth, low power consumption) require meticulous testing and optimization of operating parameters. A great deal of engineering resources can be dispensed for testing the semiconductor devices to validate functionality and/or to detect potential problems, as well as to evaluate robustness of design and performance under various operating conditions. For example, during a signal integrity (SI) testing phase, mixed-mode analyses (e.g., using an oscilloscope) may be carried out to capture analog signals from the semiconductor devices on a printed circuit board (PCB). The analog signals can be compared to simulation results and/or specifications to determine whether the semiconductor devices properly perform as designed and/or meet the specifications. Moreover, the analog signals can help to determine whether the semiconductor devices have adequate timing margins.

Moreover, various margin testing can be carried out for the semiconductor devices—e.g., once the SI testing validates the functionality of the semiconductor devices under certain operating conditions. The margin testing may include guard band testing and/or corner testing by varying voltage and temperature (e.g., four-corner testing). Varying temperature and voltage levels to extreme conditions can identify potential problems that the semiconductor devices may encounter. Further, such extreme conditions may help to identify limits (or shortcomings) in the margins for the semiconductor devices to satisfy.

Performance of semiconductor devices (e.g., memory devices, such as DRAM devices) can vary depending on overall operating environments (or settings), within which the semiconductor devices are deployed. For example, the memory devices can be tested and validated to satisfy various specifications under certain testing environments—e.g., manufacturing test environments or settings. Further, optimum operating parameters may be determined under the testing environments for the memory devices—e.g., by optimizing read/write timing and voltages for the best performance. When the memory devices are deployed within a system (e.g., system platform, such as a motherboard) to operate with other semiconductor devices (e.g., a central processing unit (CPU) of a motherboard), however, the optimum operating parameters may require further modifications (e.g., tuning, optimization), at least partially due to dissimilar physical and electrical operating environments associated with the motherboard.

For example, different lengths (and/or material properties) of conductive traces forming one or more channels between the CPU and the memory devices may result in changes in impedance characteristics (and associated reflectance characteristics) for the signals traveling across the channels. Such changes of the channel characteristics may adversely affect the memory device performance, which in turn, necessitates modifications in operating conditions for the memory device. The modifications (e.g., tuning of the operating parameters) can involve sophisticated factors determining performance of the memory devices, such as properly setting the on-die termination (ODT) parameters, read/write leveling, Vref tuning, timing training for command/address/control signals, among others. Further, the tuning is likely to be tailored to the channel characteristics of the particular motherboard, and different system vendors designing their own proprietary system platforms (e.g., motherboards) may have to carry out the "fine tuning" and margin testing when the memory devices are deployed in their system platforms.

To address the foregoing challenges, embodiments of the present disclosure provide adaptors coupled to testers (e.g., extended from the tester by a harness or a cable, wirelessly coupled to the tester, etc.) such that the adaptor can be connected to a system platform (e.g., plugged into a CPU socket of a motherboard, replacing the CPU), which includes one or more sockets configured to receive the memory devices (e.g., DRAM devices). Further, the CPU socket is coupled to the one or more DRAM sockets through one or more channels (e.g., system channel(s)). In this manner, the tester may have full control and visibility over the system channels, across which the memory devices interact with the CPU within the system platform. In other words, the adaptor can facilitate the tester to assess the system channel characteristics to determine optimum operating parameters for the memory devices deployed in the system platform—e.g., characterizing signal integrities over the system channel of the particular motherboard, monitoring "eye patterns" formed by the digital signals traveling over the system channel.

Further, the adaptors may be customized (e.g., tailored) to fit to sockets of different system platforms designed by different system vendors, providing flexibility with respect to accommodating different hardware settings of the system platforms. The adaptors, however, enables the tester to utilize the same testing algorithms to optimize operating parameters for the memory devices to perform best within a particular system platform—e.g., full suites of testing routines and/or software established for the memory devices, such as algorithmic patterns to program the memory devices with, error correcting code optimized for the memory devices, etc. Accordingly, the manufacturer of the memory devices can determine sets of optimum operating parameters (e.g., ideal basic input/output system (BIOS) settings) in view of the system channels from various system vendors implementing the memory devices such that the optimum operating parameters can be provided to the system vendors to use (and/or to begin with, for their own characterization and optimization).

FIG. 1 is a block diagram 101 illustrating a testing environment of a memory device. The diagram 101 may represent a manufacturing test environment where a manufacture of the memory device (e.g., a dynamic random access memory (DRAM) device, a DRAM module including multiple DRAM devices, a dual in-line memory module (DIMM) including multiple memory devices) tests functionality of the memory device and/or establishes performance parameters of the memory device (e.g., speed grades, access timings, latencies, etc.). The diagram 101 depicts a test board 110 (which may be a printed circuit board (PCB)) including a socket 125 and a memory device 135 connected to the socket 125 (e.g., plugged into the socket 125). The socket 125 may also be referred to as a slot—e.g., a memory slot. The socket 125 can be coupled to a tester 115 through a test channel 120. Although the diagram 101 depicts the tester 115 separate from the test board 110, the tester 115 may include the test board 110 in some embodiments.

The test channel 120 (which may include a set of sub-channels) may have been characterized (e.g., in terms of high frequency signal propagation properties, impedance characteristics, or the like) prior to testing the memory device 135 such that the tester 115 can test (or otherwise characterize) the memory device 135 without any interference or complications stemming from unknown characteristics of the test channel 120. In this manner, the manufacturer of the memory device 135 can determine operating characteristics (e.g., based on the signal integrity parameters and/or various analog signals captured during mixed mode analyses) of the memory device 135 to identify any design and/or manufacturing issues associated with the memory device 135. In this regard, the diagram 101 may be regarded as an ideal operating environment to test functionality of the memory device 135 and/or to establish performance parameters of the memory device 135—e.g., through the signal integrity testing and/or the margin testing. Further, the tester 115 may determine and set conditions for various parameters of the memory device 135 to operate with—e.g., optimum ODT parameters, read/write leveling parameters to avoid simultaneous switching noise, Vref tuned to certain levels, etc.

Although the test board 110 of FIG. 1 depicts one socket 125 (and the memory device 135 plugged in the socket 125) coupled to the tester 115 through the test channel 120 to illustrate clearly the principles of the present technology, in other embodiments, the test board 110 may include multiple sockets 125 (e.g., two, three, four, eight, sixteen, even greater) each configured to connect to individual memory devices 135. Accordingly, the test channel 120 may also be configured to couple at least a subset of the multiple sockets 125 (thus, multiple memory devices 135 connected thereto) to the tester 115 at a time—e.g., by utilizing one or more chip select (CS) signals. Additionally, or alternatively, there may be multiple test channels 120 (and/or individual test channels 120 including multiple sub-channels) coupling the tester 115 to the test board 110 with multiple sockets 125. In some embodiments, the tester 115 may be coupled to multiple test boards 110 through multiple test channels 120.

Figure 2:
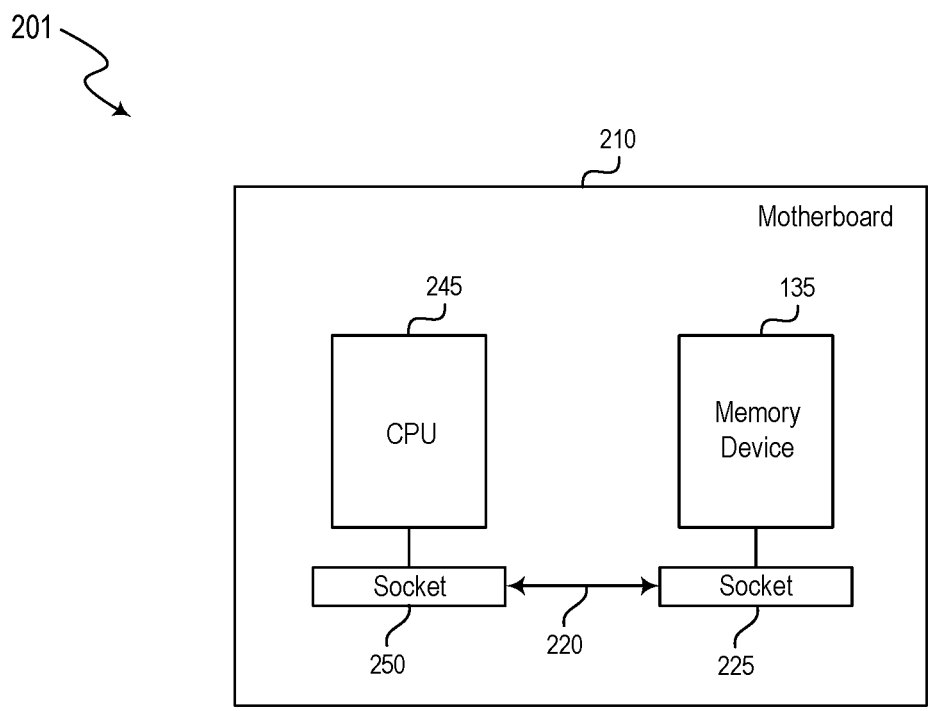
FIG. 2 is a block diagram illustrating an operating environment of a memory device.

FIG. 2 is a block diagram 201 illustrating an operating environment of a memory device (e.g., a DRAM device, a DRAM module, a DIMM). The diagram 201 may represent an operating environment where a system vendor deploys the memory device as part of a system including other semiconductor devices—e.g., a CPU, static memory 506, data storage system 518 described with reference to FIG. 5, etc. The diagram 201 depicts a motherboard 210 (e.g., a PCB, a system platform) including a socket 225 (a memory slot) connected to the memory device 135 (e.g., the memory device 135 plugged into the socket 225), another socket 250 (a CPU slot) connected to a semiconductor device 245 (e.g., a CPU), and a system channel 220 coupling the socket 225 (thus, the memory device 135) with the socket 250 (thus, the semiconductor device 245). In some embodiments, the system channel 220 may be referred to as a bus or a system bus. The semiconductor device 245 may correspond to one of a CPU, a graphics processor unit (GPU), a field-programmable gate array (FPGA), a memory controller, or an application-specific integrated circuit (ASIC). The semiconductor device 245 may be referred to as a CPU 245 hereinafter.

The memory device 135 may have been tested and "tuned" to operate with a set of optimum operating parameters in the manufacturing test environment as described above with reference to FIG. 1. The system vendor of the motherboard 210, however, may have to validate the set of operating parameters of the memory device 135, now operating in different operating environment as depicted in the diagram 201—e.g., due to differences between the socket 125 of the test board 110 and the socket 225 of the motherboard 210, into which the memory device 135 is plugged, the test channel 120 and the system channel 220, the tester 115 and the semiconductor device 245 plugged into the socket 250, among others. The system vendor may be required to spend significant engineering resource (e.g., performing extensive margin testing under various operating conditions) to validate and/or to determine the optimum operating conditions for the memory device 135 within the operation environment of the diagram 201.

Although the motherboard 210 of FIG. 2 depicts one socket 225 (and the memory device 135 plugged in the socket 225) coupled to the CPU 245 through the system channel 220 to illustrate clearly the principles of the present technology, in other embodiments, the motherboard 210 may include more than one socket 225 each configured to connect to individual memory devices 135. Additionally, the motherboard 210 may include more than one system channel 220. For example, the motherboard 210 can be configured to include two (2) DIMMs per the system channel 220. Further, the CPU 245 can communicate (transmit/receive) all signals that are shared between the two DIMMs except a chip select (CS) signal.

Figure 3:
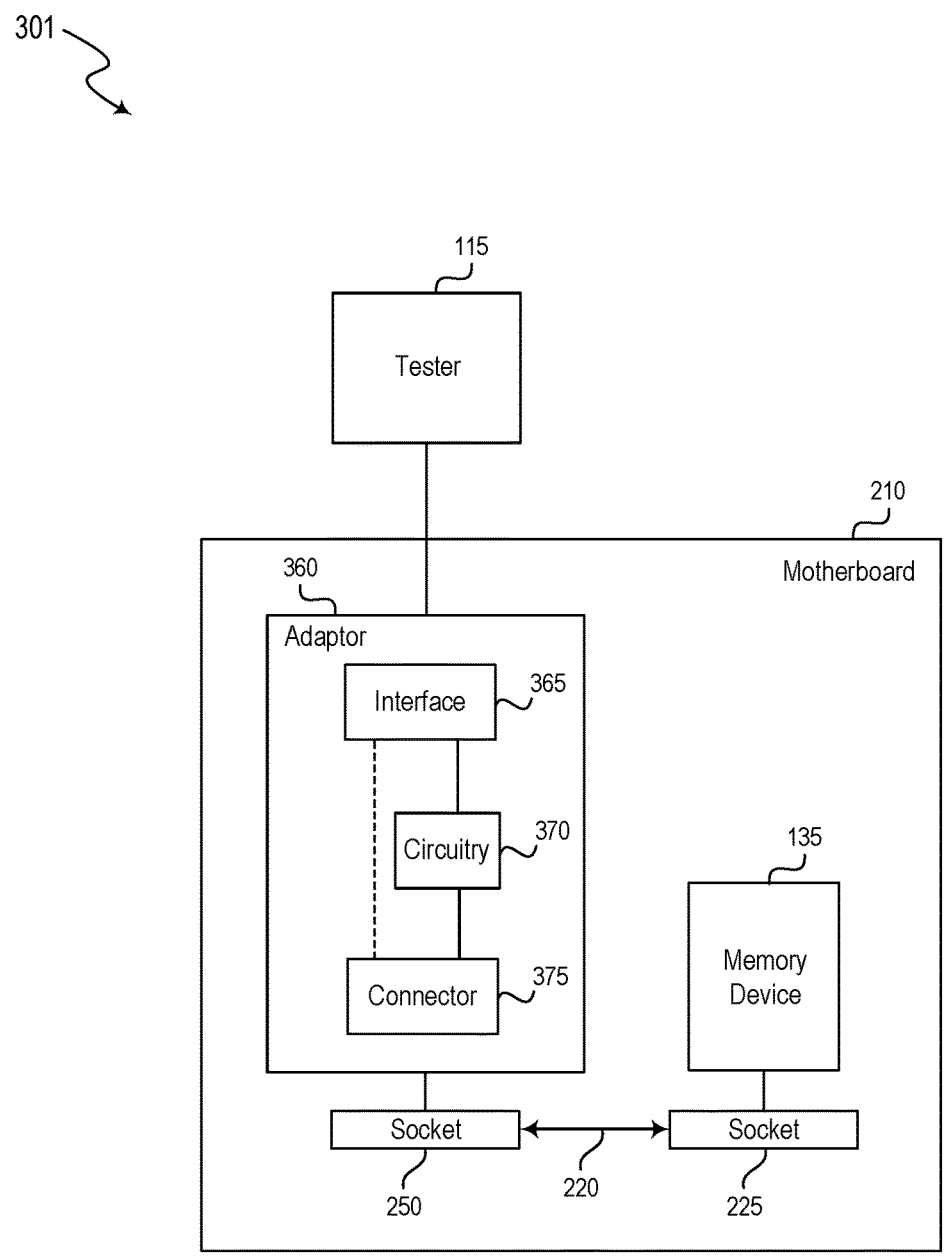
FIG. 3 is a block diagram illustrating a testing environment for characterizing a system channel in accordance with embodiments of the present disclosure.

FIG. 3 is a block diagram 301 illustrating a testing environment for characterizing a system channel, in accordance with embodiments of the present disclosure. The block diagram 301 includes aspects of the block diagram 201. For example, the diagram 301 depicts the motherboard 210 including the socket 225 connected to the memory device 135 (e.g., the memory device 135 plugged into the socket 225), the socket 250, and the system channel 220 coupling the socket 225 (thus, the memory device 135) with the socket 250. Moreover, the diagram 301 depicts an adaptor 360 connected to the socket 250 (e.g., plugged into the socket 250, replacing the CPU 245). Further, the adaptor 360 is coupled to the tester 115—e.g., through a harness, a cable, or a wireless link. As such, the diagram 301 illustrates the adaptor 360 (which is coupled to the tester 115) plugged into the socket 250 in lieu of the CPU 245. In this manner, the tester 115 can establish full control of and/or visibility over the system channel 220, across which the memory device 135 exchanges (transmit/receive, communicate) signals with the CPU 245 in the operating environment of the motherboard 210. In some embodiments, the adaptor 360 may be configured as a daughterboard compatible with the motherboard 210.

The adaptor 360 may include a connector 375 configured to connect to (e.g., plug into) the socket 250 of the motherboard 210. The adaptor 360 may also include an interface 365 including a plurality of electrical contacts configured to receive one or more signals (e.g., test signals) from the tester 115 coupled to the adaptor 360. Further, the adaptor 360 can receive output of the memory device 135 through the system channel 220, and the interface 365 may be configured to transmit the output of the memory device 135 to the tester 115. In some embodiments, the adaptor 360 includes circuitry 370 (e.g., a router) configured to route the one or more signals from the interface 365 to the connector 375. The connector 375 may include a plurality of pins (e.g., pinouts) configured engage with a plurality of receptacles of the socket 250 to provide mechanical and electrical connections therebetween. Accordingly, the circuitry 370 is configured to map the one or more signals to individual pins of the connector 375. In other embodiments, the circuitry 370 may be omitted—e.g., the interface 365 directly coupled to the connector 375 as depicted with a dotted line bypassing the circuitry 370. In such embodiments, the interface 365 may be configured to route the signals to the connector 375, or vice versa. Additionally, the interface 365 (or the connector 375) may be configured to map the signals to individual pins of the connector 375.

In this manner, the adaptor 360 can transmit the one or more signals (e.g., test signals) to the memory device 135 connected to the first socket 225 across the system channel 220 that couples the second socket 250 to the first socket 225 of the motherboard 210. In response to receiving the one or more signals across the system channel 220, the memory device 135 may generate output (e.g., transmitting data out of data pins across the system channel 220 if the one or more signals include a read command). The output generated by the memory device 135 may include current and/or voltage waveforms as a function of time—e.g., a sequence of pulses including two or more levels representing one or more bits of information. The adaptor 360 is configured to receive the output from the memory device 135 via the system channel 220 such that the adaptor 360 can transmit the output from the memory device 135 to the tester 115 through the interface 365—e.g., through the plurality of electrical contacts further configured to transmit the output to the tester 115.

In some embodiments, the one or more signals (e.g., test signals) have been determined based on testing the memory device 135 in a test environment absent influence of a particular motherboard—e.g., the manufacturing test environment of the diagram 101 including the test channel 120. As set forth in greater detail above with reference to FIG. 1, the signal transfer characteristics of the test channel 120 may have been predetermined prior to testing the memory device 135 through the test channel 120 that couples the memory device 135 to the tester 115. Further, the memory device 135 may have been set with optimum operating parameters based on testing and characterizing the memory device 135 through the test channel 120. Accordingly, the one or more signals may be regarded as initial test conditions (e.g., a first set of signals) for the tester 115 to use to test (or characterize) the memory device 135 in the testing environment of the diagram 301 including the system channel 220.

The tester 115 may receive the output of the memory device 135 through the adaptor 360 and determine to generate a second set of signals (e.g., test signals) different from the first set of signals (e.g., test signals). Subsequently, the tester 115 may transmit the second set of signals to the adaptor 360 such that the adaptor 360 can transmit the second set of signals to the memory device 135 across the system channel 220. The memory device 135 may generate another output (e.g., a second output) in response to receiving the second set of signals and transmit the second output to the adaptor 360 across the system channel 220. Thereafter, the adaptor 360 can transmit the second output to the tester 115 through the interface 365. In some embodiments, the tester 115 may compare the output and the second output to determine signal transfer characteristics of the system channel 220 based on the comparison. Further, the tester 115 may determine to modify certain operating parameters for the memory device 135 (e.g., decrease/increase Vref setting, adjusting ODT parameters, tweaking timing parameters for internal command/address signal lines of the memory module, etc.) to optimize performance of the memory device 135. The tester 115, through the adaptor 360, may repeat exchanging the signals and corresponding output from the memory device 135 across the system channel 220 until a set of the optimum operating conditions can be determined for the memory device 135 in the test environment including the system channel 220.

In this manner, the manufacturer of the memory device 135 can determine the optimum operating conditions for the memory device 135 within the test environment of the diagram 301 including the system channel 220 that mimics closely the operating environment described with reference to FIG. 2 (e.g., in a customer system). In some cases, the manufacturer may physically modify the memory device 135 (e.g., pin configurations of DIMMs) and/or change aspects of design and fabrication process of the memory device 135 (or future products similar to the memory device 135) to improve performance in the customer system, based on determining the optimum operating condition. Moreover, the manufacturer can determine multiple sets of optimum operating conditions, each tailored to a corresponding system platform such that system vendors can start their validation (and/or optimization) using the optimum operating conditions tailored to their proprietary system platforms, respectively. In some cases, the manufacturer may provide recommendations for physically modifying the system platform. For example, the manufacturer may recommend relocating the socket 225 (and/or the socket 250) to improve routing of the motherboard 210, changing overall layout and/or materials of the motherboard 210 to reduce cross talk, modifying power delivery to the memory device 135, utilizing different sockets to improve signal integrity.

Although in the foregoing example embodiments, memory devices deployed in a system platform (e.g., a motherboard) have been described and illustrated as DRAM devices and/or DRAM modules (or DIMMs), in other embodiments, additional and/or alternative memory devices could be provided. For example, 3D NAND memory devices, phase change memory (PCM) devices, ferroelectric random access memory (FRAM) devices, synchronous dynamic RAM (SDRAM) devices, etc. may also be utilized. Moreover, the adaptors have been described and illustrated to fit (e.g., plug) into CPU sockets to characterize system channels between the CPU sockets and the memory sockets of system platforms, the present technology is not limited thereto. For example, the adaptors may be devised (otherwise modified) to fit (e.g., plug) into other sockets of the system platforms such that the adaptors can provide direct access to the other sockets coupled to different components of the system platform across different channels (e.g., a portion of bus 530 coupled to the static memory 506, a portion of bus 530 coupled to the data storage system 518 (e.g., a solid state drive) described with reference to FIG. 5). In some embodiments, the present technology can be utilized to characterize (or control) power consumption at a system level (e.g., within the system platform)—e.g., to determine optimum operating conditions for various components of the system platform from power control perspectives.

Figure 4:
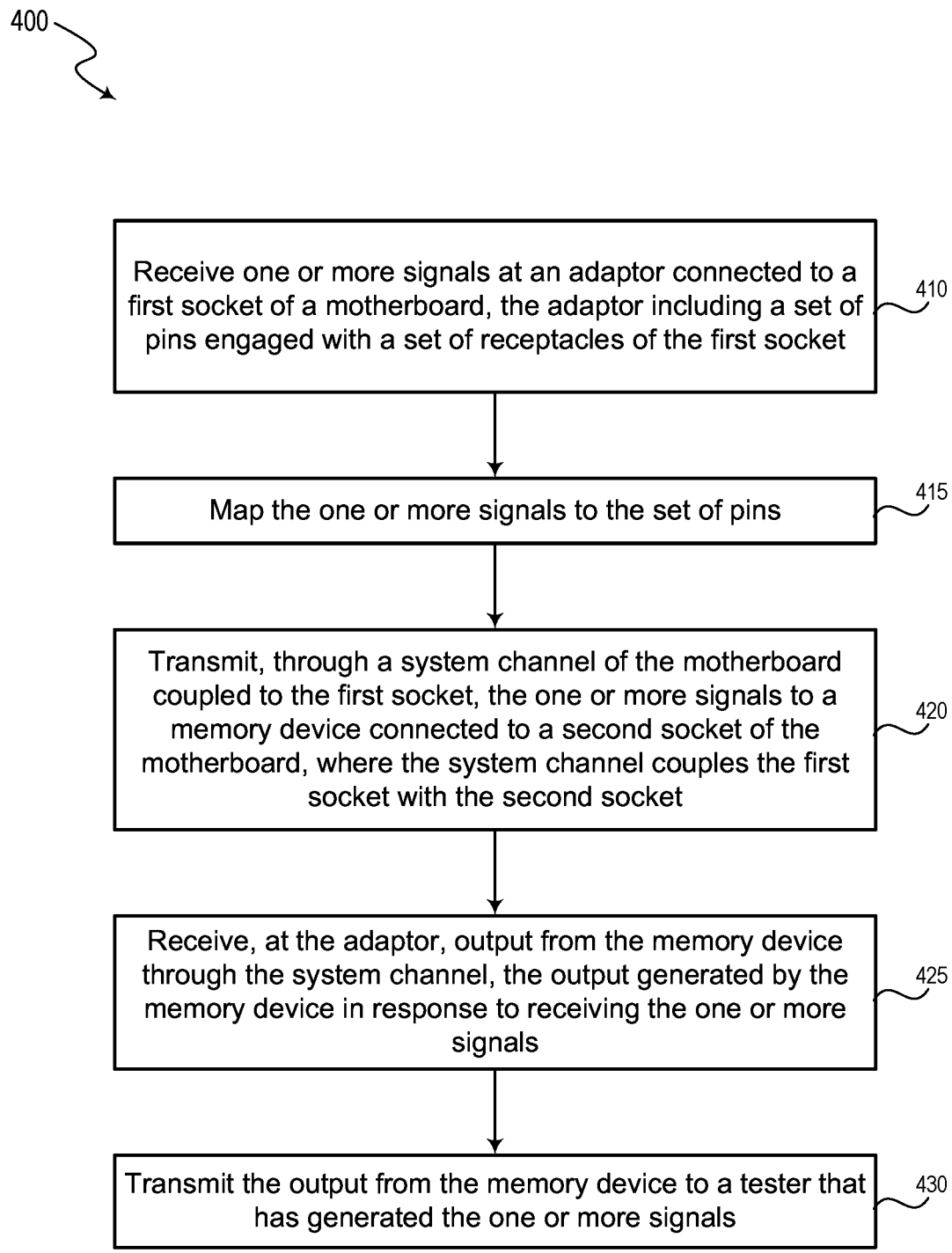
FIG. 4 is a flowchart illustrating a method of characterizing a system channel according to embodiments of the present disclosure.

FIG. 4 is a flowchart 400 illustrating a method of characterizing a system channel according to embodiments of the present disclosure. The flowchart 400 may be an example of or include aspects of a method that an adaptor coupled to a tester (e.g., the adaptor 360) may perform as described with reference to FIG. 3.

The method includes receiving one or more signals at an adaptor connected to a first socket of a motherboard, the adaptor including a plurality of pins engaged with a plurality of receptacles of the first socket (box 410). In accordance with one aspect of the present technology, the receiving feature of box 410 can be performed by the interface 365, as described with reference to FIG. 3.

The method further includes mapping the one or more signals to the plurality of pins (box 415). In accordance with one aspect of the present technology, the mapping feature of box 415 can be performed by the circuitry 370, as described with reference to FIG. 3.

The method further includes transmitting, through a system channel of the motherboard coupled to the first socket, the one or more signals to a memory device connected to a second socket of the motherboard, where the system channel couples the first socket with the second socket (box 420). In accordance with one aspect of the present technology, the transmitting feature of box 420 can be performed by the connector 375, as described with reference to FIG. 3.

The method further includes receiving, at the adaptor, output from the memory device through the system channel, the output generated by the memory device in response to receiving the one or more signals (box 425). In accordance with one aspect of the present technology, the receiving feature of box 425 can be performed by the connector 375, as described with reference to FIG. 3.

The method further includes transmitting the output from the memory device to a tester that has generated the one or more signals (box 430). In accordance with one aspect of the present technology, the transmitting feature of box 430 can be performed by the interface 365, as described with reference to FIG. 3.

In some embodiments, the one or more signals correspond to a first set of signals, and the method may further include receiving a second set of signals at the adaptor in response to transmitting the output from the memory device to the tester, the second set of signals different from the first set of signals, mapping the second set of signals to the plurality of pins, and transmitting the second set of signals to the memory device through the system channel.

In some embodiments, the output corresponds to first output generated by the memory device, and the method may further include receiving, at the adaptor, second output from the memory device through the system channel, the second output generated by the memory device in response to receiving the second set of signals, and transmitting the second output from the memory device to the tester.

Figure 5:
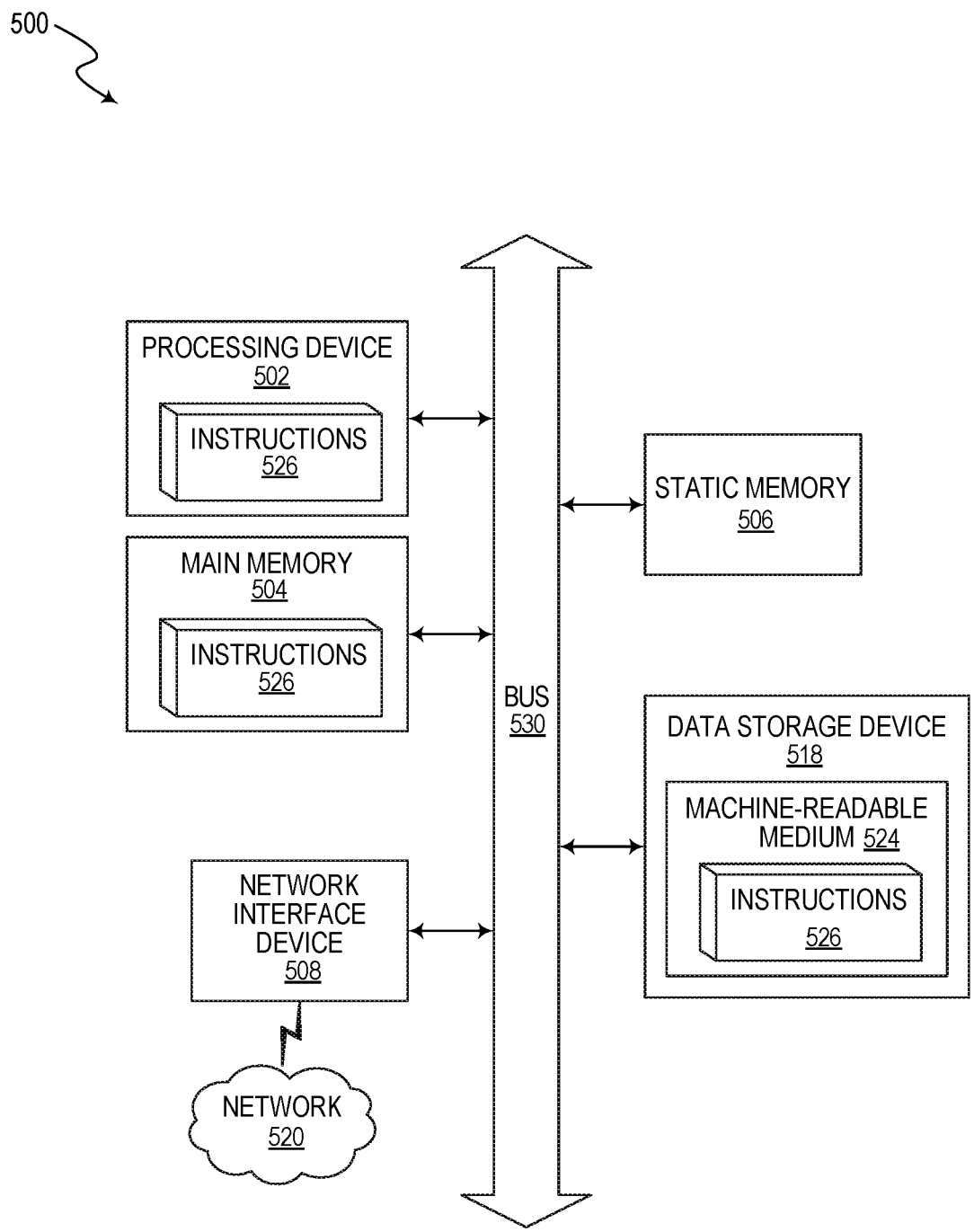
FIG. 5 is a block diagram schematically illustrating a computer system in accordance with embodiments of the present disclosure.

FIG. 5 is a block diagram schematically illustrating a computer system in accordance with an embodiment of the present disclosure. As can be seen with reference to FIG. 5, an example machine of a computer system 500 can include a set of instructions, which can cause the machine to perform various functions when executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. In some embodiments, signal transfer characteristics of the bus 530 may have been determined as described herein (e.g., using the adaptor 360 described with reference to FIG. 3) such that operating parameters of the main memory 504 are optimized to provide high performance for the computer system 500. Processing device 502 represents one or more general-purpose processing devices such as a microprocessor, a central processing unit (CPU), or the like. More particularly, the processing device 502 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a non-transitory machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media.

While the non-transitory machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-5 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
 a connector configured to connect to a first socket of a motherboard, the first socket configured to receive a semiconductor device;
 an interface comprising a plurality of electrical contacts configured to receive one or more test signals from a tester coupled to the apparatus; and
 circuitry configured to route the one or more test signals from the interface to the connector,
 wherein the apparatus is configured to, if connected to the first socket through the connector, transmit the one or more test signals to a memory device connected to a second socket of the motherboard via a system channel of the motherboard coupling the first socket with the second socket.

2. The apparatus of claim 1, wherein the connector comprises a plurality of pins configured to engage with a plurality of receptacles of the first socket to provide mechanical and electrical connections therebetween, and wherein the circuitry is further configured to map the one or more test signals to individual pins of the connector.

3. The apparatus of claim 1, wherein the semiconductor device corresponds to one of a central processor unit (CPU), a graphics processor unit (GPU), a field-programmable gate array (FPGA), a memory controller, or an application-specific integrated circuit (ASIC).

4. The apparatus of claim 1, wherein the one or more test signals have been determined based on testing a predetermined memory device in a test environment including a test channel having predetermined signal transfer characteristics and configured to couple the predetermined memory device to the tester.

5. The apparatus of claim 4, wherein the memory device is a dynamic random access memory (DRAM) device.

6. The apparatus of claim 1, wherein the apparatus is further configured to receive output from the memory device via the system channel, the output generated by the memory device in response to receiving the one or more test signals.

7. The apparatus of claim 6, wherein the output generated by the memory device includes current and/or voltage waveforms as a function of time.

8. The apparatus of claim 6, wherein the apparatus is further configured to transmit the output to the tester through the interface.

9. A method, comprising:
 receiving one or more signals at an adaptor connected to a first socket of a motherboard, the adaptor including a plurality of pins engaged with a plurality of receptacles of the first socket;
 mapping the one or more signals to the plurality of pins;
 transmitting, through a system channel of the motherboard coupled to the first socket, the one or more signals to a memory device connected to a second socket of the motherboard, wherein the system channel couples the first socket with the second socket;
 receiving, at the adaptor, output from the memory device through the system channel, the output generated by the memory device in response to receiving the one or more signals; and
 transmitting the output from the memory device to a tester that has generated the one or more signals.

10. The method of claim 9, wherein the one or more signals correspond to a first set of signals, the method further comprising:
 receiving a second set of signals at the adaptor in response to transmitting the output from the memory device to the tester, the second set of signals different from the first set of signals;
 mapping the second set of signals to the plurality of pins; and
 transmitting the second set of signals to the memory device through the system channel.

11. The method of claim 10, wherein the output corresponds to first output generated by the memory device, the method further comprising:
 receiving, at the adaptor, second output from the memory device through the system channel, the second output generated by the memory device in response to receiving the second set of signals; and
 transmitting the second output from the memory device to the tester.

12. The method of claim 9, wherein:
 the first socket is configured to receive one of a central processor unit (CPU), a graphics processor unit (GPU), a field-programmable gate array (FPGA), a memory controller, or an application-specific integrated circuit (ASIC); and the memory device is a dynamic random access memory (DRAM) device.

13. A system, comprising:

a tester; and an adaptor connected to the tester, including:
- a connector configured to connect to a first socket of a motherboard, the first socket configured to receive a central processing unit (CPU);
- an interface comprising a plurality of electrical contacts configured to receive one or more test signals from the tester; and
- circuitry configured to route the one or more test signals from the interface to the connector, wherein the adaptor is configured to, if connected to the first socket through the connector, transmit the one or more test signals to a memory device connected to a second socket of the motherboard via a system channel of the motherboard coupling the first socket with the second socket.

14. The system of claim 13, wherein the connector comprises a plurality of pins configured to engage with a plurality of receptacles of the first socket to provide mechanical and electrical connections therebetween, and wherein the circuitry is further configured to map the one or more test signals to individual pins of the connector.

15. The system of claim 13, wherein the adaptor is further configured to receive output from the memory device via the system channel, the output generated by the memory device in response to receiving the one or more test signals.

16. The system of claim 15, wherein the adaptor is further configured to transmit the output to the tester through the interface.

17. The system of claim 16, wherein the one or more test signals correspond to a first set of test signals, and wherein the tester is configured to:

receive the output from the adaptor;

determine to generate a second set of test signals different from the first set of test signals based, at least in part, on receiving the output; and transmit the second set of test signals to the adaptor.

18. The system of claim 17, wherein the tester is further configured to:

receive second output generated by the memory device in response to transmitting the second set of test signals; and compare the output and the second output to determine signal transfer characteristics of the system channel.

* * * * *